US006556152B2

(12) United States Patent
Pitio et al.

(10) Patent No.: US 6,556,152 B2
(45) Date of Patent: Apr. 29, 2003

(54) DESERIALIZER

(75) Inventors: Walter Michael Pitio, Morganville, NJ (US); Donald David Shugard, Middletown, NJ (US)

(73) Assignee: Parama Networks, Inc., San Jose, CA (US)

( * ) Notice: Subject to any disclaimer, the term of this patent is extended or adjusted under 35 U.S.C. 154(b) by 0 days.

(21) Appl. No.: 09/909,499

(22) Filed: Jul. 20, 2001

(65) Prior Publication Data

US 2003/0030576 A1 Feb. 13, 2003

(51) Int. Cl.[7] .............................................. H03M 9/00
(52) U.S. Cl. ...................................................... 341/101
(58) Field of Search .............................. 341/100, 101, 341/143; 370/366

(56) References Cited

U.S. PATENT DOCUMENTS 5,490,282 A    2/1996  Dreps et al.
5,757,297 A    5/1998  Ferralolo
6,097,323 A  * 8/2000  Koga ........................ 341/101

* cited by examiner

*Primary Examiner*—Brian Young
(74) *Attorney, Agent, or Firm*—DeMont & Breyer, LLC

(57) ABSTRACT

A deserializer is disclosed that incorporates a detection and feedback mechanism for ensuring that the deserializer samples a serialized stream of bits at advantageous times. Furthermore, a deserializer is disclosed that can operate at a frequency that is below the bit rate of the serialized stream of bits. The illustrative embodiment comprises: a first bi-stable storage device for receiving a first binary waveform and a first clock signal and for generating a second binary waveform based on the first binary waveform and on the first clock signal; a second bi-stable storage device for receiving the first binary waveform and a second clock signal and for generating a third binary waveform based on the first binary waveform and on the second clock signal; and unanimity logic for generating a fourth binary waveform based on a coincidence function of the second binary waveform and the third binary waveform.

16 Claims, 9 Drawing Sheets

100

200-A

200-B

DESERIALIZER

FIELD OF THE INVENTION

The present invention relates to telecommunications in general, and, more particularly, to an apparatus for converting a serialized stream of bits into parallel words.

BACKGROUND OF THE INVENTION

There are situations where parallel words of bits need to be transmitted via a serial communications channel. In these situations, a first apparatus converts the words into a serialized stream of bits for transmission on the serial communications channel. Typically the first apparatus is known as a serializer.

At the receiving end of the serial communications channel, a second apparatus captures the serialized stream of bits and restores it back into parallel words. Typically, the second apparatus is known as a deserializer. Regardless of what the first apparatus and the second apparatus are called, the second apparatus performs the inverse operation of the first apparatus.

FIG. 1 depicts a block diagram of serial communications system 100 in the prior art, which comprises: serializer 101, deserializer 102, timing source 103, timing source 104, and serial communications channel 111, interconnected as shown.

Serializer 101 receives a parallel word of bits and a clock signal (e.g., a clock signal, etc.) from timing source 103 and converts the parallel word into a serialized stream of bits for transmission via serial communications channel 111. For example, serializer 101 can comprise a parallel-load-in/serial-shift-out register that loads words in at a slower rate than it shifts bits out.

Serial communications channel 111 is a logical data structure that can be carried alone or can be multiplexed with other serial communications channels, via a metal wireline, an optical fiber, or a wireless channel (e.g., radio, infrared, etc.).

Deserializer 102 receives the serialized stream of bits from serial communications channel 111 and a clock signal from timing source 104, captures the serialized stream of bits, and converts it back into a parallel word. For example, deserializer 102 can comprise a serial-shift-in/parallel-unload-out shift register that unloads words more slowly than it shifts bits in.

The design and operation of deserializer 102 can be problematic. For example, if deserializer 102 samples the serialized stream of bits at the right time (i.e., when each bit in the serialized stream of bits is stable) deserializer 102 will capture a genuine bit that represents a valid value. In contrast, if deserializer 102 samples the serialized stream of bits at the wrong time (i.e., when some or all of the bits in the serialized stream of bits is in transition) deserializer 102 will capture a spurious bit that represents a false value. Furthermore, deserializer 102 might be incapable of distinguishing between when it is capturing genuine bits and when it is capturing spurious bits.

The design and operation of deserializer 102 is particularly problematic when: (1) timing source 103 is asynchronous to timing source 104, and (2) when timing source 104 is asynchronous to the transitions in the serialized stream of bits.

One common approach to this problem in the prior art is to greatly oversample the serialized stream of bits with the knowledge that by doing so the intervals of stability can be distinguished from the intervals of transition.

Another common approach to this problem in the prior art is to employ a phase-locked loop in the deserializer to sense when the transitions occur in the serialized stream of bits.

These approaches have well-known disadvantages, however, and, therefore, the need exists for a deserializer without some of the costs and disadvantages of deserializers in the prior art.

SUMMARY OF THE INVENTION

Some embodiments of the present invention enable the deserialization of one or more serialized streams of bits without some of the costs and disadvantages for doing so in the prior art. For example, the illustrative embodiment of the present invention incorporates a detection and feedback mechanism for ensuring that the deserializer samples each serialized stream of bits at the right time. In other words, the illustrative embodiment automatically detects when to sample a serialized stream of bits and adjusts that time, if necessary, to compensate for variations (e.g., jitter, wander, etc.) in either: (i) the transitions of the serialized stream of bits, or (ii) the timing source of the deserializer, or (iii) both the transitions of the serialized stream of bits and the timing source of the deserializer.

Furthermore, embodiments of the present invention can be used to parallelize a serial stream of bits that have not previously existed in parallel. In other words, equipment exists that originally generates one or more serial streams of bits, and the illustrative embodiment can be used to parallelize those serial streams of bits even though they have never previously existed in parallel.

And still furthermore, the illustrative embodiment of the present invention can operate at a frequency that is below the bit rate of the serialized stream of bits. This can be advantageous for several reasons.

First, the illustrative embodiment enables a device to capture a serialized stream of bits with a bit rate that is higher than the rate at which the device itself can operate. For example, the illustrative embodiment enables an integrated circuit technology that can operate at up to 300 MHz to capture a serialized stream of bits with a 3000 Mbs bit rate.

Second, the illustrative embodiment enables a device with a low-frequency timing source to capture a serialized stream of bits with a high bit rate. This is advantageous because a low-frequency timing source is often less expensive and more stable than a high-frequency timing source.

Third, the illustrative embodiment enables a device to operate at a low clock rate and yet to capture a serialized stream of bits with a high bit rate. This is advantageous because a device that operates at a low clock rate can use less power (i.e., wattage) than a gate equivalent circuit that operates at a higher clock rate.

And fourth, the illustrative embodiment enables a device to avoid deriving or modifying its clock signal from the serialized stream of bits, which eliminates the possibility that jitter in the serialized stream of bits can pollute the clock signal of the deserializer.

The illustrative embodiment comprises: a first bi-stable storage device for receiving a first binary waveform and a first clock signal and for generating a second binary waveform based on the first binary waveform and on the first clock signal; a second bi-stable storage device for receiving the first binary waveform and a second clock signal and for generating a third binary waveform based on the first binary waveform and on the second clock signal; and unanimity logic for generating a fourth binary waveform based on a coincidence function of the second binary waveform and the third binary waveform.

DETAILED DESCRIPTION

Figure 1:
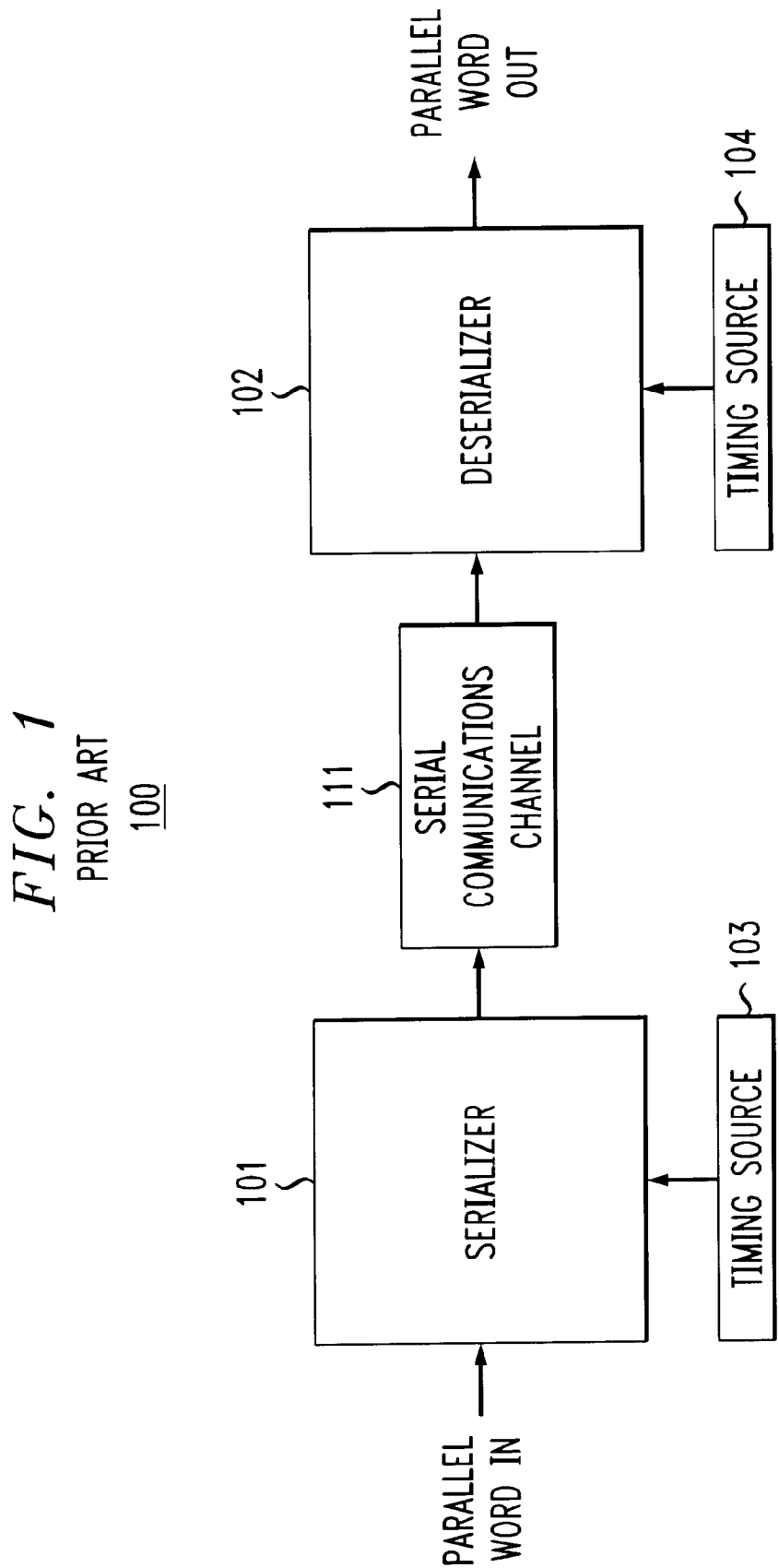
FIG. 1 depicts a block diagram of a serializer, a serial communications channel, and a deserializer as known in the prior art.
Figure 2:
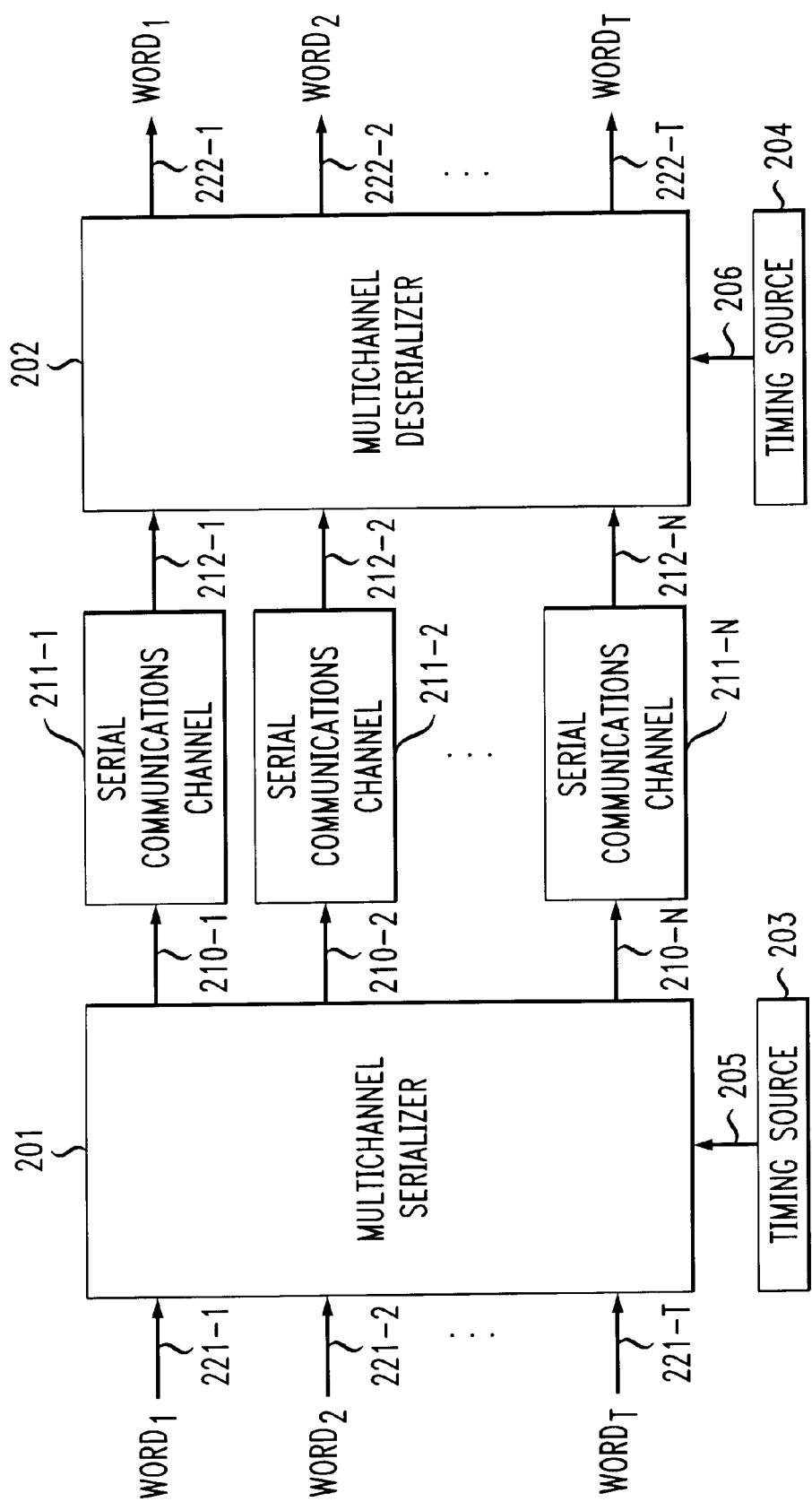
FIG. 2 depicts a block diagram of the first variation of the illustrative embodiment of the present invention.

FIG. 2 depicts a block diagram of the first variation of the illustrative embodiment of the present invention, which comprises: multichannel serializer 201, multichannel deserializer 202, N serial communications channels 211-1 through 211-N, wherein N is a positive integer greater than zero, timing source 203, and timing source 204, all of which are interconnected as shown. In accordance with the first variation of the illustrative embodiment of the present invention, multichannel serializer 201 and multichannel deserializer 202 are each provided with clock signals that are independent of and asynchronous to each other.

Figure 3:
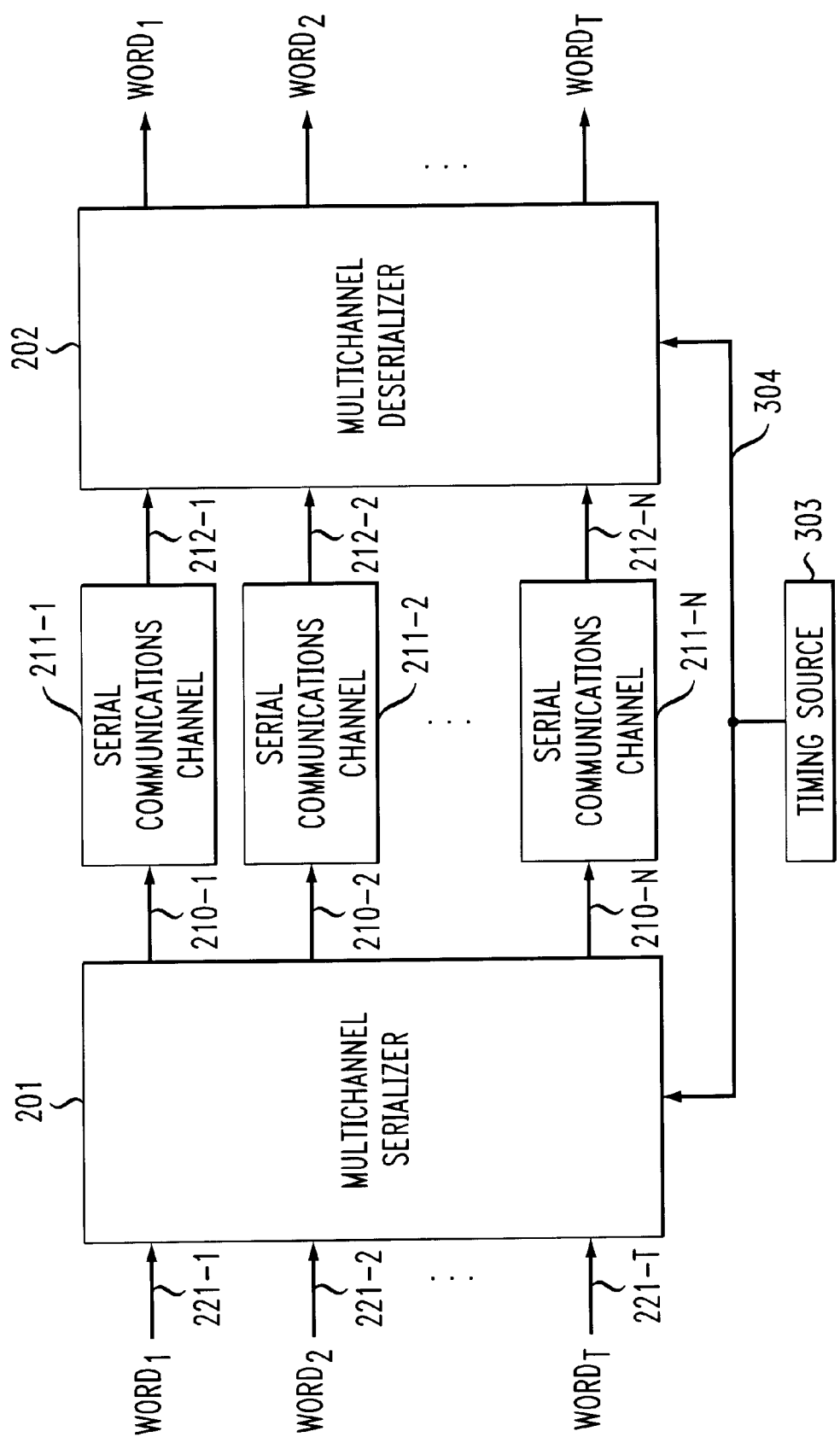
FIG. 3 depicts a block diagram of the second variation of the illustrative embodiment of the present invention.

FIG. 3 depicts a block diagram of the second variation of the illustrative embodiment of the present invention, which comprises: multichannel serializer 201, multichannel deserializer 202, N serial communications channels 211-1 through 211-N, wherein N is a positive integer greater than zero, and timing source 303, all of which are interconnected as shown. In accordance with the second variation of the illustrative embodiment of the present invention, multichannel serializer 201 and multichannel deserializer 202 are each provided with a clock signal from the same timing source. In all other respects, the two variations of the illustrative embodiment are identical, and, therefore, will be described solely in common.

With reference to both FIGS. 2 and 3, there are 64 serial communications channels between multichannel serializer 201 and multichannel deserializer 202 (i.e., N=64). In accordance with the illustrative embodiment, each of serial communications channels 211-1 through 211-N is carried from multichannel serializer 201 to multichannel deserializer 202 via a distinct optical fiber. Furthermore, because each of serial communications channels 211-1 through 211-N is a logical channel, in some alternative embodiments of the present invention two or more of serial communications channels 211-1 through 211-N can be multiplexed with each other and transmitted to multichannel deserializer 202 via a metal wireline, an optical fiber, or a wireless channel (e.g., radio, infrared, etc.). After reading this specification and the accompanying figures, it will be clear to those skilled in the art how to make and use embodiments of the present invention in which N equals a value of other than 64.

Multichannel serializer 201 receives T parallel words, $word_1$, through $word_T$, wherein T is a positive integer greater than zero, on buses 221-1 through 221-T, respectively, and a clock signal from a timing source (e.g., timing source 203, timing source 303, etc.). Multichannel serializer 201 outputs a serialized version of $word_1$ through $word_T$ to serial communications channels 211-1 through 211-N. In accordance with the illustrative embodiment, T=16. After reading this specification and the accompanying figures, it will be clear to those skilled in the art how to make and use embodiments of the present invention in which T equals a value of other than 16.

In accordance with the illustrative embodiment of the present invention, each $word_1$ through $word_T$ comprises W bits, wherein W is a positive integer greater than zero. In accordance with the illustrative embodiment, W=32. After reading this specification and the accompanying figures, it will be clear to those skilled in the art how to make and use embodiments of the present invention in which W equals a value of other than 32. Furthermore, after reading this specification and the accompanying figures, it will be clear to those skilled in the art how to make and use embodiments of the present invention in which some of $word_1$ through $word_T$ comprise a different number of bits than other of $word_1$ through $word_T$ comprise.

When multichannel serializer 201 multiplexes two or more bits from a single word over one serial communications channel, all of the bits from the word that are multiplexed over the serial communications channel are called a "symbol." In accordance with the illustrative embodiment of the present invention, each word of $word_1$ through $word_T$ comprises M symbols, wherein M is equal to N/T. In accordance with the illustrative embodiment, M=N/T=64/16=4. After reading this specification and the accompanying figures, it will be clear to those skilled in the art how to make and use embodiments of the present invention in which M equals a value of other than 4. Furthermore, after reading this specification and the accompanying figures, it will be clear to those skilled in the art how to make and use embodiments of the present invention in which some of $word_1$ through $word_T$ comprise a different number of symbols than other of $word_1$ through $word_T$ comprise.

In accordance with the illustrative embodiment, there are W/M bits in each symbol before it is encoded with a symbol and/or word synchronization scheme. In accordance with the illustrative embodiment, the number of bits in each symbol equals W/M=32/4=8.

In accordance with the illustrative embodiment, multichannel serializer 201 encodes the bits in each symbol with the well-known 8B/10B encoding scheme, which facilitates symbol and/or word synchronization by multichannel deserializer 202. Therefore, there are B=W/M+Z bits in each symbol after it is encoded with a symbol and/or word synchronization scheme, wherein Z equals the number of bits added to the symbol as part of the symbol and/or word synchronization scheme. In accordance with the 8B/10B encoding scheme, Z=2 and, therefore, B=W/M+Z=32/4+2=10. In some alternative embodiments of the present invention, a different symbol and/or word synchronization scheme is used and in some alternative embodiments of the present invention, no symbol and/or word synchronization scheme is used. Furthermore, after reading this specification and the accompanying figures, it will be clear to those skilled in the art how to make and use embodiments of the present invention in which some of the symbols comprise a different number of bits than other symbols comprise.

In accordance with the illustrative embodiment, multichannel serializer 201 uses a binary modulation scheme (e.g., binary shift-keying, etc.) and transmits each bit independently over a serial communications channel. In some alternative embodiments of the present invention however, multichannel serializer combines the bits from two or more serial communications channels using a non-binary modulation scheme (e.g., quadriphase-shift keying, etc.) and transmits multiple bits simultaneously over a serial communications channel.

Multichannel serializer 201 outputs N sets of B bits onto each of serial communications channels 211-1 through 211-N for each set of T words received by multichannel serializer 201. As is well known to those skilled in the art, multichannel serializer 201 can comprise N B-bit parallel-load-in/serial-shift-out registers that shift out bits at B times the rate at which words are loaded into the registers. Furthermore, multichannel serializer 201 operates in pipeline-processor fashion, meaning that it continually receives one set of T parallel words after another and transmits N sets of B bits onto each of serial communications channels 211-1 through 211-N for each set of T words received by it. It is well known to those skilled in the art how to make and use multichannel serializer 201.

In accordance with the illustrative embodiment, the propagation delay through each of serial communications channels 211-1 through 211-N need not be the same nor need it remain constant throughout time.

Multichannel deserializer 202 receives a serialized stream of bits from each of serial communications channels 211-1 through 211-N, and a clock signal (e.g., from timing source 204, from timing source 303, etc.), and from them reconstructs and outputs T parallel words, word, through word$_T$, on buses 222-1 through 222-T. Furthermore, multichannel deserializer 202 operates in pipeline-processor fashion, meaning that it continually outputs one set of T parallel words after another for each of the N sets of B bits it receives from serial communications channels 211-1 through 211-N.

In accordance with the illustrative embodiment of the present invention, the frequency of the clock signal used by multichannel deserializer 202 is 1/B times the bit rate of the serialized stream of bits as transmitted by multichannel serializer 201. In other words, multichannel deserializer 202 operates at a rate that is below the bit rate of the serialized stream of bits it captures. In some alternative embodiments of the present invention, the frequency of the clock signal used by multichannel deserializer 202 is something other than 1/B times the bit rate of the serialized stream of bits as transmitted by multichannel serializer 201.

Figure 4:
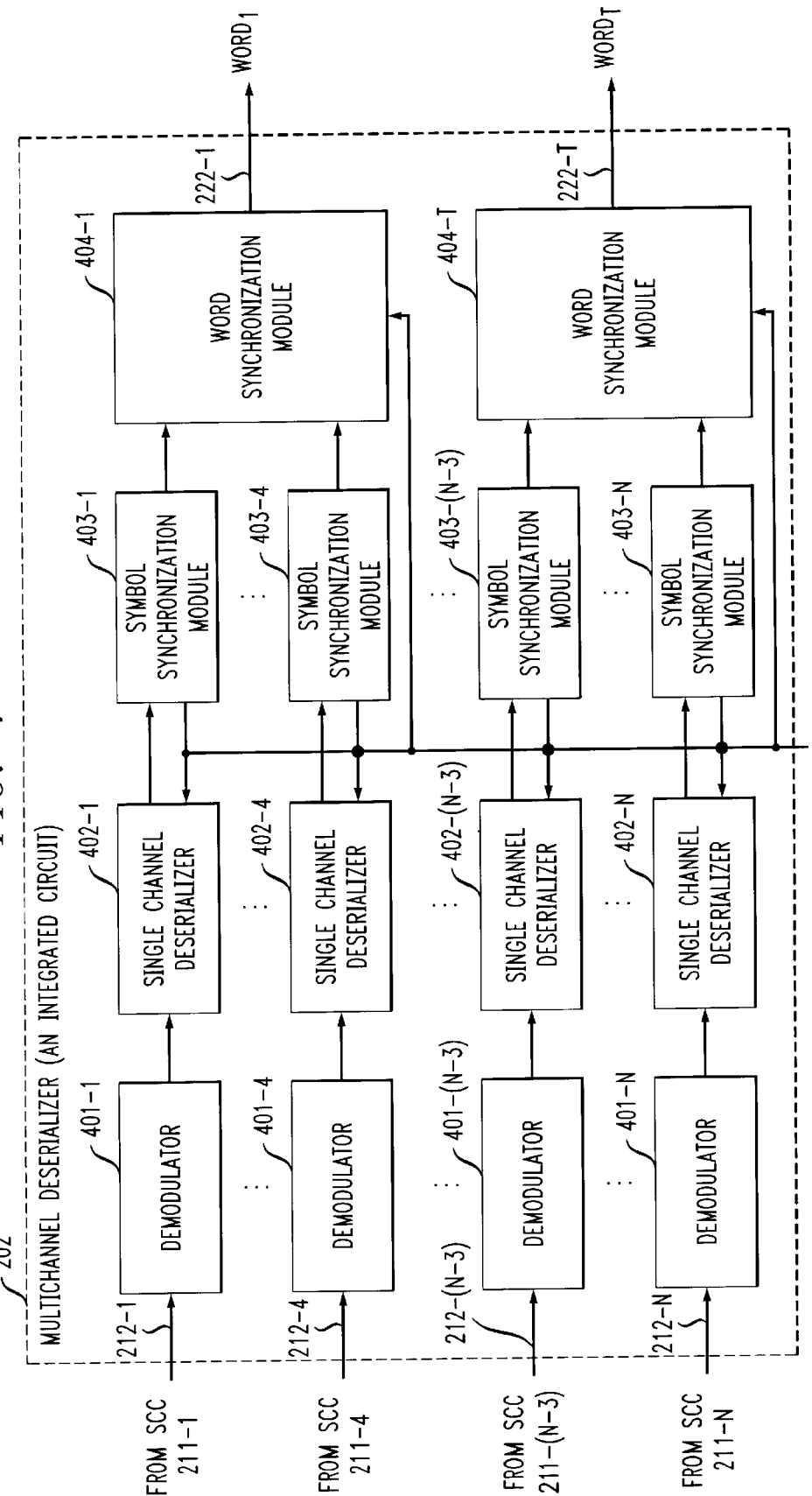
FIG. 4 depicts a block diagram of the salient components of multichannel deserializer 202 as depicted in FIG. 2 and FIG. 3.

FIG. 4 depicts a block diagram of the salient components of multichannel deserializer 202, which comprises: N demodulators 401-1 through 401-N, N single-channel deserializers 402-1 through 402-N, N symbol synchronization modules 403-1 through 403-N, and T word synchronization modules 404-1 through 404-T, interconnected as shown.

In accordance with the illustrative embodiment, multichannel deserializer 202 is fabricated on an integrated circuit. For the purposes of this specification, the term "integrated circuit" is defined as a slice or chip of material on which is etched or imprinted a complex of electronic components and their interconnections.

Demodulator 401-$i$, for i=1 to N, receives a modulated serialized stream of bits from serial communications channel 211-$i$, demodulates the modulated serialized stream of bits, and outputs a serialized stream of bits to single channel deserializer 402-1. It is well known to those skilled in the art how to make and use demodulator 401-$i$.

As is described in detail below and with respect to FIGS. 7 through 9, single-channel deserializer 402-$i$, for i=1 to N, receives: (1) a serialized stream of bits from demodulator 401-$i$ and (2) the clock signal from timing source 204/303 and outputs B bits in parallel to symbol synchronization module 403-$i$.

Symbol synchronization module 403-$i$ receives B bits in parallel from single-channel deserializer 402-$i$ and resynchronizes the symbols (i.e., regroups the bits into symbols) and outputs the symbols to the associated word synchronization module. In accordance with the illustrative embodiment, symbol synchronization module 403-$i$ decodes the 8B/10B encoding of multichannel serializer 201 and outputs 8 bits for each 10 bits that are received. It is well known to those skilled in the art how to make and use symbol synchronization module 403-$i$.

Word synchronization module 404-$p$, for p=1 to T, receives M symbols from M associated symbol synchronization modules and resynchronizes the words (i.e., regroups the symbols into words) in well-known fashion. It is well known to those skilled in the art how to make and use word synchronization module 404-$p$.

Figure 5:
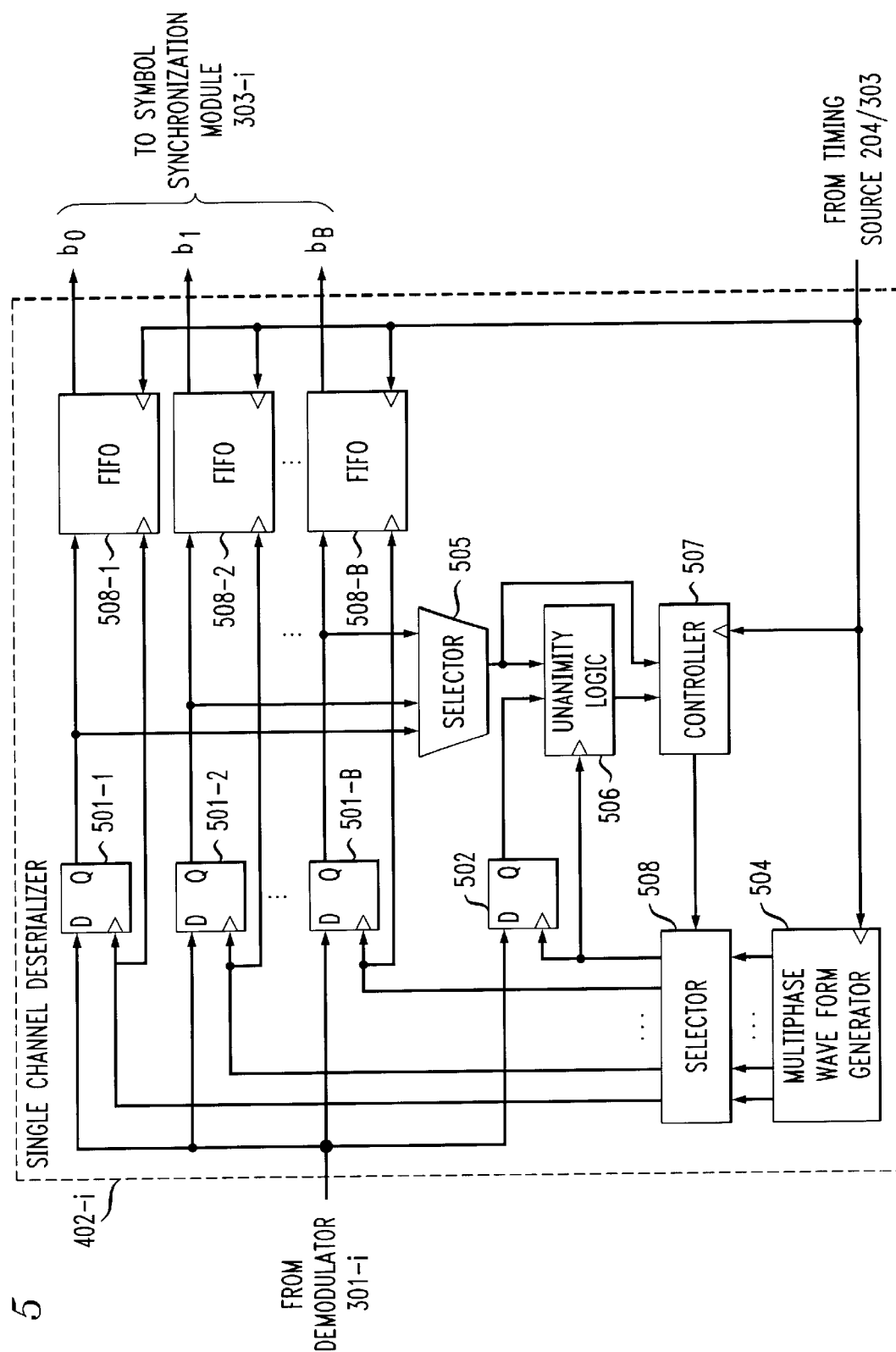
FIG. 5 depicts a block diagram of the salient components of single channel deserializer 402-$i$ as depicted in FIG. 4.

FIG. 5 depicts a block diagram of the salient components of single channel deserializer 402-$i$. Single channel deserializer 402-$i$ comprises: bi-stable storage devices 501-1 through 501-B, bi-stable storage device 502-1, selector 503, multiphase waveform generator 504, selector 505, unanimity logic 506, controller 507, and FIFOs 508-1 through 508-B, all of which are interconnected as shown.

Figure 6:
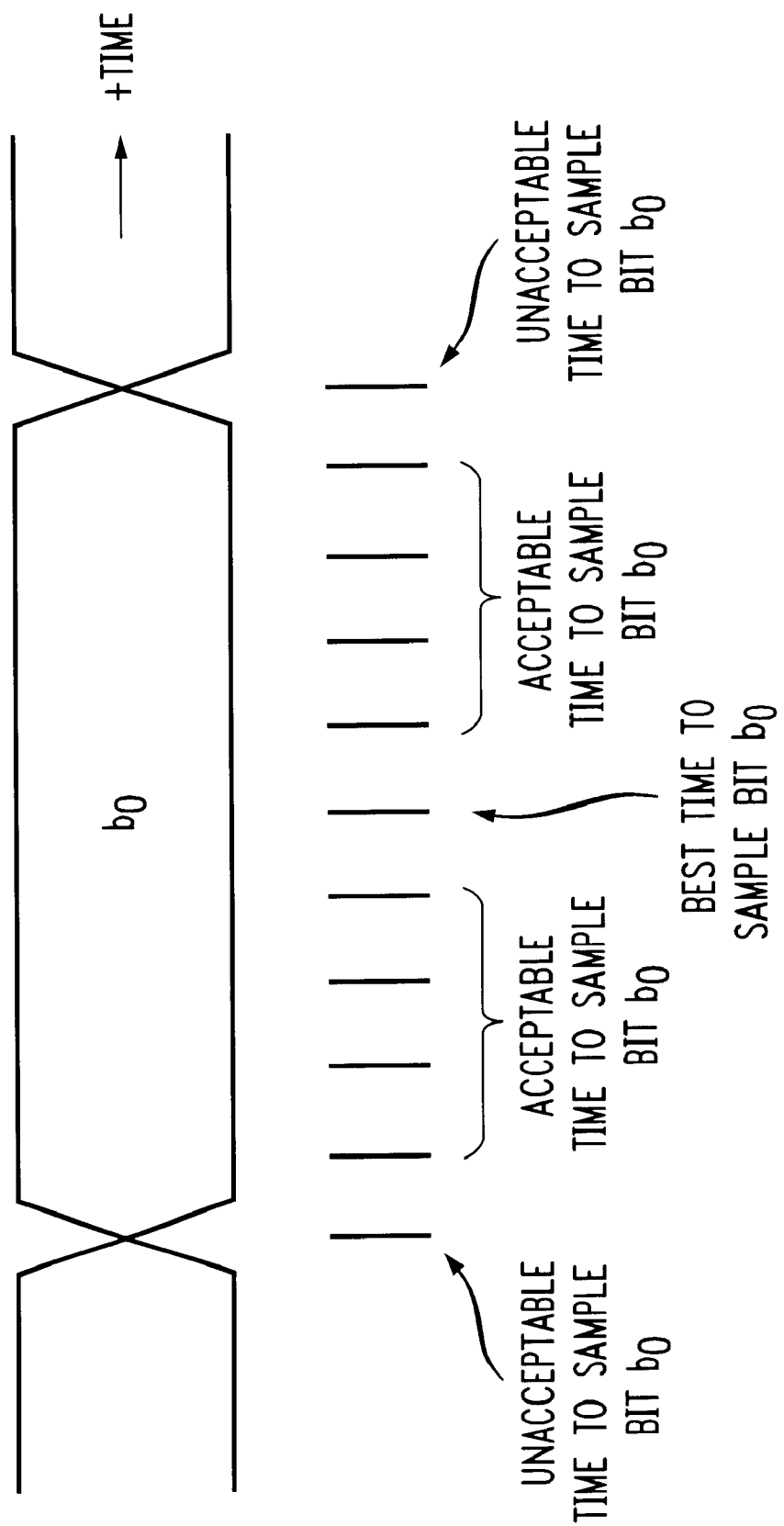
FIG. 6 depicts a temporal graph of one bit, bit $b_0$, in the serialized stream of bits.

The purpose of each of bi-stable storage devices 501-1 through 501-B is to capture one bit in each series of B bits in the serialized stream of bits from serial communications channel 211-$i$. In other words, bi-stable storage devices 501-1 through 501-B are designed, in aggregate, to take B samples or "snapshots" of the serialized stream of bits at different times in each series of B bits. For example, FIG. 6 depicts a temporal graph of one bit, bit $b_0$, in the serialized stream of bits.

The best time to sample bit $b_0$ is in the center of the "eye" of bit $b_0$ (i.e., the center of when bit $b_0$ is stable). Depending on the technology of the bi-stable storage device, the clock signal might occur before or after the sample time. It is acceptable, although less so, to sample bit $b_0$ before or after the center of the eye because the likelihood increases that the signal will be spurious at those times. It is unacceptable to sample bit $b_0$ during signal transitions.

The time at which each of bi-stable storage devices 501-1 through 501-B samples the serialized stream of bits is determined in accordance with a differently-phased clock signal that is generated by multiphase waveform generator 504 and routed to it by selector 503 under the direction of controller 507. In other words, multiphase waveform generator 504 generates many differently-phased clock signals so that at least one of them is properly phased to enable the capture of one bit in each series of B bits. The process by which controller 507 decides which differently-phased clock signal to direct to which bi-stable storage device is described below and with respect to FIGS. 7 through 9. Furthermore, as is also described below, single channel deserializer 402-*i* incorporates a detection and feedback mechanism for ensuring that each bit continues to be sampled at an appropriate time even if there is jitter or wander in the serialized stream of bits or in the timing signal from timing source 204/303.

In some alternative embodiments of the present invention, single channel deserializer 402-*i* comprises more than B bi-stable storage devices. In particular, single channel deserializer 402-*i* comprises Q*B bi-stable storage devices, wherein Q is a positive integer greater than zero. In this case, the purpose of each of bi-stable storage devices 501-1 through 501-Q*B is to capture one bit in every Qth series of B bits that are received from serial communications channel 211-*i*.

In some alternative embodiments of the present invention, single channel deserializer 402-*i* comprises fewer than B bi-stable storage devices. In particular, single channel deserializer 402-*i* comprises B/Y bi-stable storage devices, wherein B/Y is a positive integer greater than zero. In this case, the purpose of each of bi-stable storage devices 501-1 through 501-B/Y is to capture Y bits in every series of B bits that are received from serial communications channel 211-*i*.

In accordance with the illustrative embodiment of the present invention, bi-stable storage devices 501-1 through 501-B are identical D-type flip-flops that each receive the input from serial communications channel 211-*i* at their D input. In some alternative embodiments of the present invention, bi-stable storage devices 501-1 through 501-B are another kind of bi-stable storage device, such as a J-K flip-flop, a T-type flop-flop, or a latch.

The purpose of multiphase waveform generator 504 is to generate the differently-phased clock signals used to clock bi-stable storage devices 501-1 through 501-B. To this end, multiphase waveform generator 504 generates R*B clock signals based on the clock signal from timing source 204 or 303, wherein each of the R*B clock signals is 360°/(R*B) out of phase with respect to each other. In accordance with the illustrative embodiment of the present invention, R represents the resolution of the phrase difference of the clock signals.

For example, in accordance with the illustrative embodiment, B=10, R=12, and, therefore, multiphase waveform generator 504 outputs one hundred and twenty (120) clock signals as depicted in Table 1.

TABLE 1

Clock signals From Multiphase Waveform Generator 504 (for B = 10 & R = 12)

| Clock Signal No. | Phase |
|---|---|
| 0 | 0° |
| 1 | 3° |
| 2 | 6° |
| ... | ... |
| 117 | 351° |
| 118 | 354° |
| 119 | 357° |

It will be clear to those skilled in the art how to make and use multiphase waveform generator 504. For example, multiphase waveform generator 504 can be a delay line comprising a cascade of 240 inverters, each of an appropriate delay, such that the output of every other inverter is one of the 120 clock signals. In some alternative embodiments of the present invention, R has a value other than 12. Larger values of R increase the likelihood that controller 507 will have at its disposal B clock signals, each of which has an advantageous phase for clocking in one bit in each series of B bits from a serial communications channel. Larger values of R also increase the complexity of multichannel deserializer 202.

The purpose of selector 503 is to enable controller 507 to be capable of directing clock signals from multiphase waveform generator 504 to bi-stable storage devices 501-1 through 501-B and to bi-stable storage device 502-1. It will be clear to those skilled in the art that selector 503 need not be capable of directing any clock signal from multiphase waveform generator 504 to any bi-stable storage devices 501-1 through 501-B.

Because each of bi-stable storage devices 501-1 through 501-B is clocked at a different time, their outputs—the candidate bits, $b_0$ through $b_B$—also change at different times. Because this is asynchronous to the clock signal from timing source 204 and the circuitry in the symbol synchronization modules, the outputs of bi-stable storage devices 501-1 through 501-B need to be synchronized. In accordance with the illustrative embodiment, FIFOs 508-1 through 508-B synchronize the transitions of the captured bits, $b_0$ through $b_B$.

The output of bi-stable storage device 501-*j*, for j=1 through B, is clocked into FIFO 508-*j* and with the same clock signal that is used to clock bi-stable storage device 501-*j*. To this end, FIFO 508-*j* is a one-bit wide first-in, first-out memory whose output is clocked with the waveform from timing source 204 and is, therefore, asynchronous to the clocking of its inputs. Furthermore, FIFO 508-*j* is at least three bits and advantageously five bits deep.

Because controller 507 is responsible for determining which of bi-stable storage devices 501-1 through 501-B receive which clock signals from multiphase waveform generator 504, controller 507 is capable of discerning when each of bi-stable storage devices 501-1 through 501-B is sampling a genuine stable signal that represents a valid value and when it is sampling a spurious signal in transition. To accomplish this, bi-stable storage device 502-1, selector 505, and unanimity logic 506 enable controller 507 to discern when each of bi-stable storage devices 501-1 through 501-B is sampling a genuine stable signal that represents a valid value and when it is not. In other words, bi-stable storage device 502-1, selector 505, and unanimity logic 506 enable controller 507 to discern when each of bi-stable storage devices 501-1 through 501-B should be clocked.

Bi-stable storage device 502-1 is advantageously identical to each of bi-stable storage devices 501-1 through 501-B and its clock input is also fed from selector 503 so that controller 507 can direct that any clock signal from multiphase waveform generator 504 be routed to bi-stable storage device 502-1. The output of bi-stable storage device 502-1 is fed into one input of unanimity logic 506.

Selector 505 is a B-to-1 selector (e.g., multiplexor, etc.) under the direction of controller 507 that enables controller 507 to select the output of one of bi-stable storage devices 501-1 through 501-B for input into a second input of unanimity logic 506. Controller 507 also receives the output of selector 505 so that controller 507 can count the number of signal transitions in the output of any of bi-stable storage devices 501-1 through 501-B, which is useful for reasons described below and with respect to FIGS. 7 through 9.

In some alternative embodiments of the present invention, controller 507 receives the output of selector 505 so that controller 507 can observe the output of any of bi-stable storage devices 501-1 through 501-B. This is advantageous because it enables controller 507 to perform symbol synchronization (i.e., the function performed by symbol synchronization module 403-*i*) when a training sequence is transmitted via serial communications channel 211-*i*.

Unanimity logic 506 compares the two signals from bi-stable storage device 502-1 and selector 505 and indicates when the two signals are the same and when they are not. When the output of unanimity logic 506 is consistently the same when it is stable (e.g., at instants that are 180° out of phase with respect to the clock signal clocking bi-stable storage device 502-1, etc.), it suggests that the signal from selector 505 is genuine. This, in turn, suggests that the bi-stable storage device feeding selector 505 is capturing a stable bit and that the clock signal routed to the bi-stable storage device feeding selector 505 is acceptable.

In contrast, when the output of unanimity logic 506 is often different when it is stable (e.g., at instants that are 180° out of phase with respect to the clock signal clocking bi-stable storage device 502-1, etc.), it suggests that the signal from selector 505 is spurious. This, in turn, suggests that the bi-stable storage device feeding selector 505 is not capturing a genuine bit and that a different clock signal should be routed to the bi-stable storage device feeding selector 505.

In accordance with the illustrative embodiment, unanimity logic 506 performs an H-input Boolean coincidence function, wherein H is a positive integer greater than one. For the purposes of this specification, a 2-input "coincidence function" is defined as any of the eight Boolean functions depicted in Table 2.

TABLE 2

The 2-Input Coincidence Functions

| | |
|---|---|
| $A \oplus B$ | $\overline{A \oplus B}$ |
| $\overline{A} \oplus B$ | $\overline{\overline{A} \oplus B}$ |
| $A \oplus \overline{B}$ | $\overline{A \oplus \overline{B}}$ |
| $\overline{A} \oplus \overline{B}$ | $\overline{\overline{A} \oplus \overline{B}}$ |

For the purposes of this specification, a 3-input "coincidence function" is defined as any of the sixteen Boolean functions depicted in Table 3.

TABLE 3

The 3-Input Coincidence Functions

| | | | |
|---|---|---|---|
| $A \oplus B \oplus C$ | $\overline{A} \oplus B \oplus C$ | $\overline{A \oplus B \oplus C}$ | $\overline{\overline{A} \oplus B \oplus C}$ |
| $A \oplus B \oplus \overline{C}$ | $\overline{A} \oplus B \oplus \overline{C}$ | $\overline{A \oplus B \oplus \overline{C}}$ | $\overline{\overline{A} \oplus B \oplus \overline{C}}$ |
| $A \oplus \overline{B} \oplus C$ | $\overline{A} \oplus \overline{B} \oplus C$ | $\overline{A \oplus \overline{B} \oplus C}$ | $\overline{\overline{A} \oplus \overline{B} \oplus C}$ |
| $A \oplus \overline{B} \oplus \overline{C}$ | $\overline{A} \oplus \overline{B} \oplus \overline{C}$ | $\overline{A \oplus \overline{B} \oplus \overline{C}}$ | $\overline{\overline{A} \oplus \overline{B} \oplus \overline{C}}$ |

In accordance with the illustrative embodiment of the present invention, unanimity logic 506 is an Boolean exclusive-OR gate. It will be clear to those skilled in the art that in some alternative embodiments of the present invention, unanimity logic 506 is a Boolean exclusive-NOR gate. For the purposes of this specification, the term "unanimity logic" is defined as logic that performs a coincidence function. The output of unanimity logic 506 is fed into controller 507.

Figure 7:
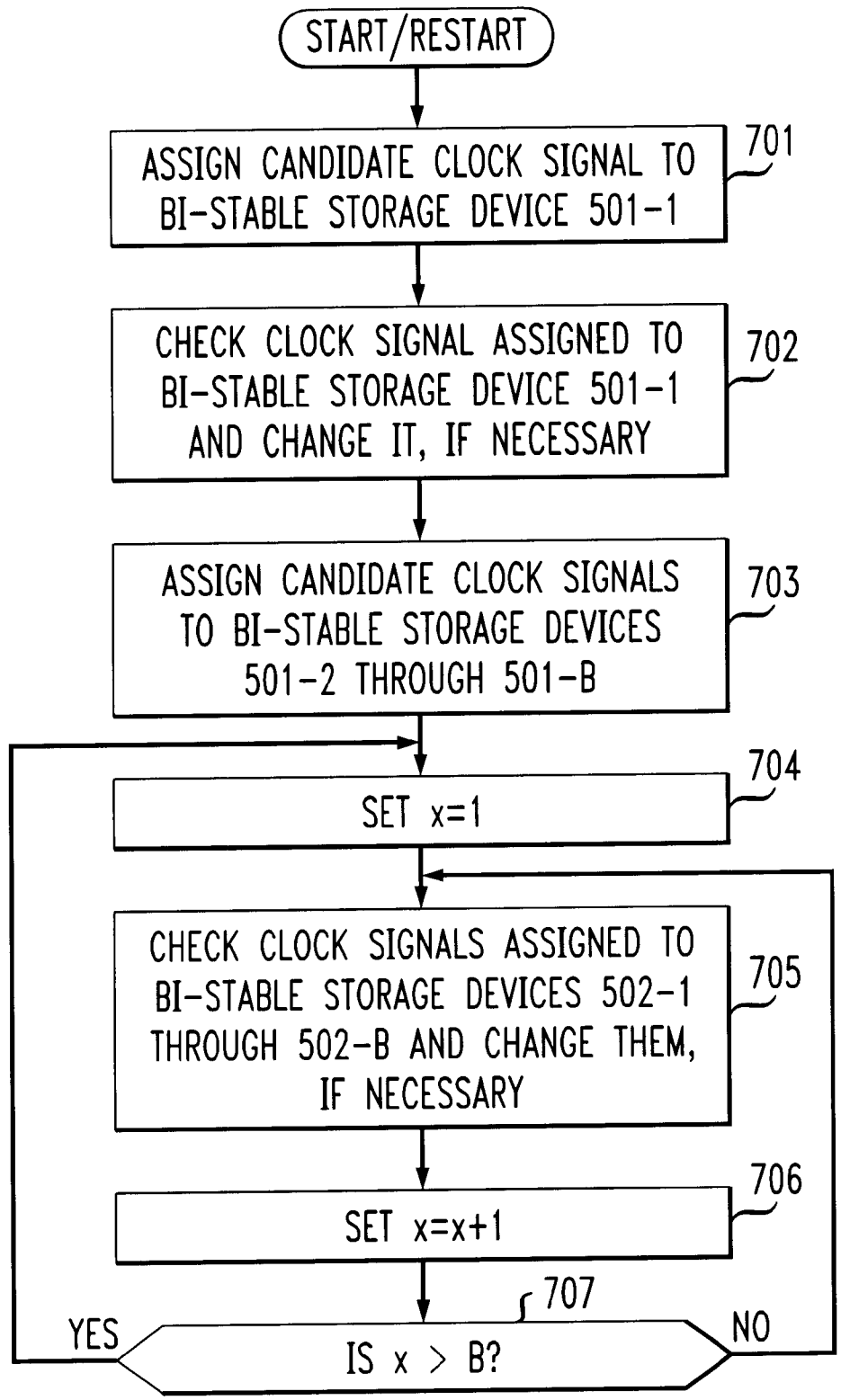
FIG. 7 depicts a flowchart of the operations performed by controller 507 in assigning clock signals to each of bi-stable storage devices 501-1 through 501-B.
Figure 8:
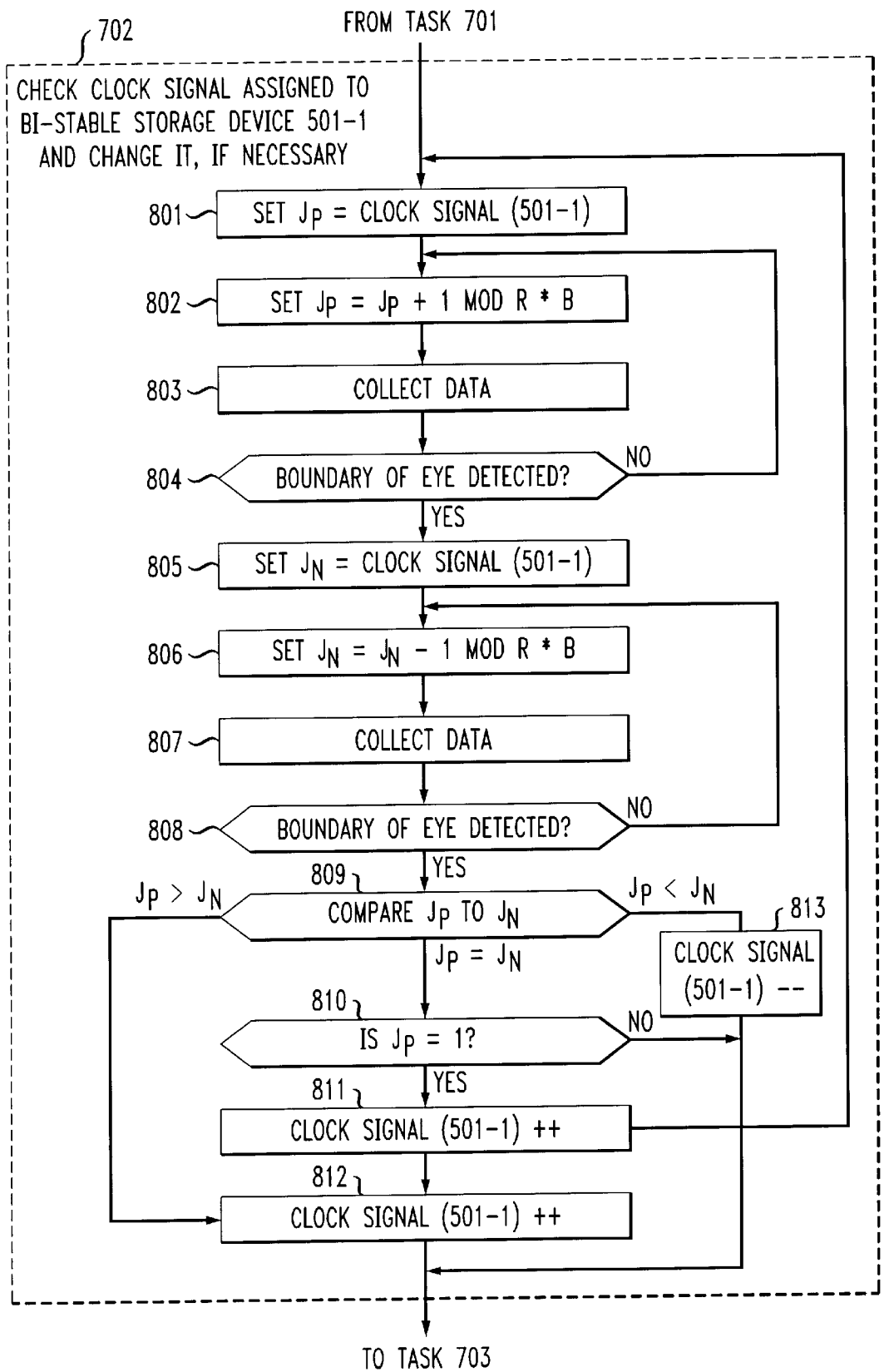
FIG. 8 depicts the subtasks that compose task 702 as depicted in FIG. 7.
Figure 9:
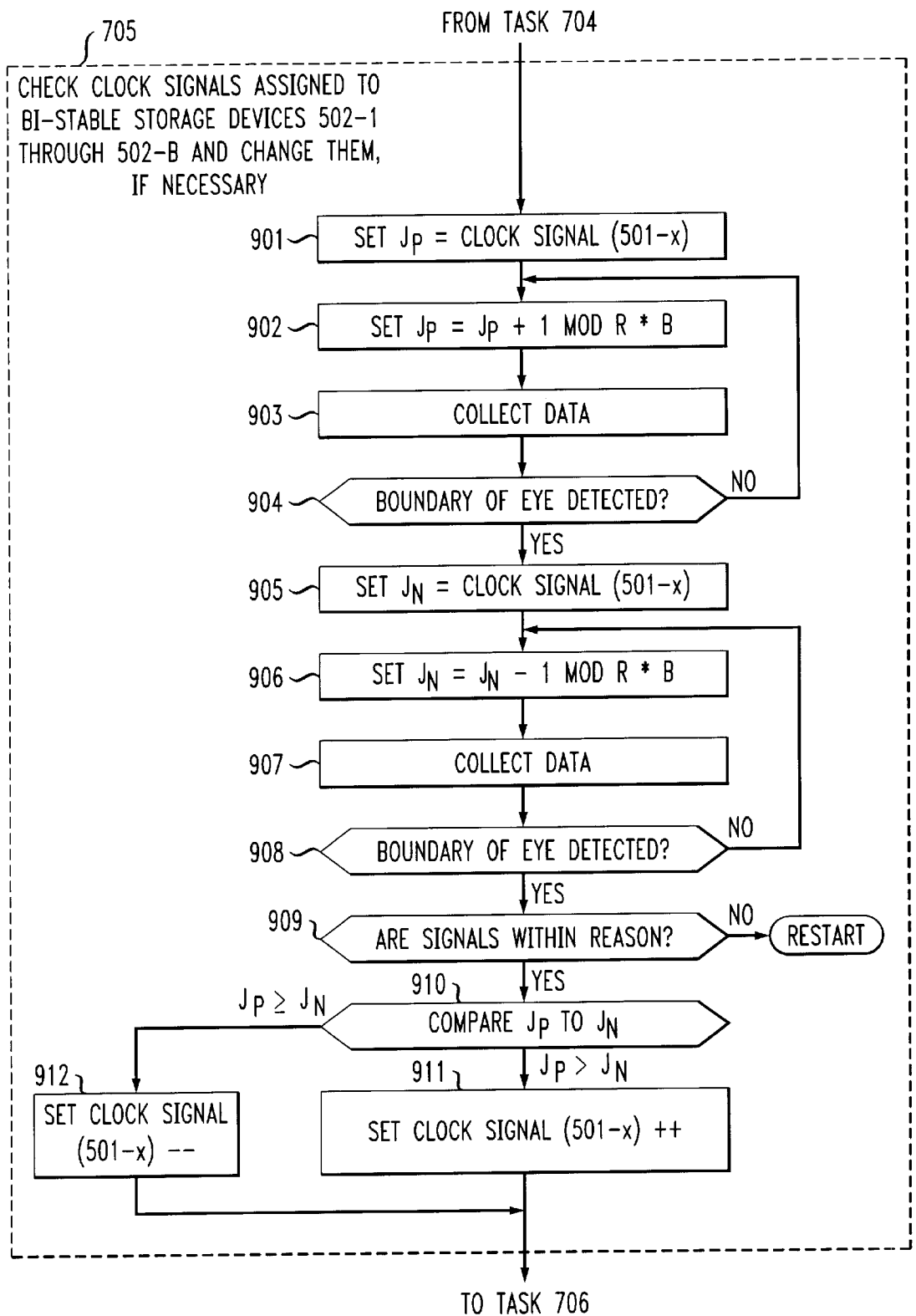
FIG. 9 depicts the subtasks that compose task 705 as depicted in FIG. 7.

In accordance with the illustrative embodiment, controller 507 is a microprocessor that is programmed to perform the functionality described herein and with respect to FIGS. 7 through 9. It will be clear to those skilled in the art that in some alternative embodiments of the present invention, controller 507 can comprise hard-wired combinatorial and sequential logic that performs the functionality described herein and with respect to FIGS. 7 through 9.

FIG. 7 depicts a flowchart of the operations performed by controller 507 in assigning clock signals to each of bi-stable storage devices 501-1 through 501-B.

At task 701, controller 507 assigns a candidate clock signal from multiphase waveform generator 504 to bi-stable storage device 501-1. Because controller 507 cannot at this point predict when the signal transitions occur in the serialized stream of bits, the assignment of the first clock signal to bi-stable storage device 501-1 can be arbitrary. Therefore, in accordance with the illustrative embodiment, controller 507 assigns the first clock signal (i.e., clock signal number 0) from multiphase waveform generator 504 to bi-stable storage device 501-1. This can be represented by Equation 1.

$$\text{clock signal}(501\text{-}1) = 0 \quad \text{(Eq. 1)}$$

wherein "clock signal(501-F)" represents the clock signal number assigned to bi-stable storage device 501-F.

At task 702, controller 507 checks and changes, if necessary, the clock signal assigned to bi-stable storage device 501-1. The subtasks that compose task 702 are described below and with respect to FIG. 8. Task 702 has several purposes. First, task 702 detects if the clock signal assigned to bi-stable storage device 501-1 is synchronized with the transitions in the serialized stream of bytes, and is, therefore, causing bi-stable storage device 501-1 to capture spurious values. Second, if the clock signal assigned to bi-stable storage device 501-1 is causing bi-stable storage device 501-1 to capture spurious values, task 702 advances the clock signal assigned to bi-stable storage device 501-1 until bi-stable storage device 501-1 captures genuine values. Third, if the clock signal assigned to bi-stable storage device 501-1 is causing bi-stable storage device 501-1 to capture genuine values, task 702 measures how well centered in eye the clock signal is and changes the clock signal assigned to bi-stable storage device 501-1 to be more centered, if necessary.

In some alternative embodiments of the present invention, task 702 is performed while single-channel deserializer 402-*i* receives a training sequence that is known to controller 507. As will be clear to those skilled in the art, the presence of the training sequence facilitates the task of controller 507 in completing task 702.

At task 703, controller 507 assigns a candidate clock signal from multiphase waveform generator 504 to each of bi-stable storage devices 501-2 through 501-B with the goal of having each of bi-stable storage devices 501-1 through 501-B capture a different bit in each symbol. Although controller 507 again cannot at this point predict when the signal transitions occur in the signal arriving from serial communications channel 211-*i*, it can make an educated guess as to which clock signals from multiphase waveform generator 504 to assign to each of bi-stable storage devices 501-2 through 501-B by recognizing that a bit arrives on serial communications channel 211-*i* every 360°/B. Furthermore, controller 507 can reasonably assume that after task 702 the assignment of the clock signal from multiphase waveform generator 504 to bi-stable storage device 501-1 is acceptable. Therefore, at task 702, controller 507 assigns the clock signal from multiphase waveform generator 504 that is offset in phase by 360(j−1)°/B from the signal assigned to bi-stable storage device 501-1 for bi-stable storage device 501-*j*, for j=2 to B. This can be represented by Equation 2.

$$\text{clock signal}(501\text{-}j) = [\text{clock signal}(501\text{-}1) + R*(j-1)] \bmod R*B \quad \text{(Eq. 2)}$$

At tasks 704 through 707, controller 507 iteratively checks and changes, if necessary, the clock signal assigned to bi-stable storage devices 501-1 through 501-B.

At task 704, controller 507 sets a loop value, X, to 1 (i.e., X=1).

At task 705, controller 507 checks and changes, if necessary, the clock signal assigned to bi-stable storage device 501-X, if necessary. The subtasks that compose task 705 are described below and with respect to FIG. 9.

In some alternative embodiments of the present invention, task 705 is performed while single-channel deserializer 402-i receives a training sequence that is known to controller 507. As will be clear to those skilled in the art, the presence of the training sequence facilitates the task of controller 507 in completing task 705.

At task 706, controller 507 increments the value of the loop value, X, by 1 (i.e., X++).

At task 707, controller 507 compares the current value of X to B. When X is greater than B, control passes to task 704; otherwise control passes to task 705.

FIG. 8 depicts the subtasks that compose task 702.

Subtasks 801 through 804 determine how far the clock signal assigned to bi-stable storage device 501-1 is from the later-in-time boundary of the eye.

At subtask 801, controller 507 sets a variable, Jp, equal to the clock signal assigned to bi-stable storage device 501-1. This can be represented by Equation 3.

$$Jp=\text{clock signal}(501\text{-}1) \tag{Eq. 3}$$

Furthermore, as part of subtask 801, controller 507 directs selector 505 to route the output of bi-stable storage device 501-1 to unanimity logic 506.

At subtask 802, controller 507 increments the variable Jp mod R*B and directs selector 503 to route clock signal Jp to bi-stable storage device 502-1. This can be represented by Equation 4.

$$Jp=[Jp+1]\bmod R*B \tag{Eq. 4}$$

At subtask 803, controller 507 counts how many times unanimity logic 506 detects a lack of coincidence between the output of bi-stable storage device 501-1 and the output of bi-stable storage device 502-1 in the course of some number of transitions of the output of bi-stable storage device 501-1. Controller 507 is capable of detecting the number of transitions in the output of bi-stable storage device 501-1 because the output of selector 505 is fed into controller 507. For example, controller 507 advantageously counts how many times unanimity logic 506 detects a lack of coincidence between the output of bi-stable storage device 501-1 and the output of bi-stable storage device 502-1 in the course of 1000 signal transitions of the output of bi-stable storage device 501-1.

At subtask 804, controller 507 determines whether clock signal Jp is at the later-in-time boundary of the eye, which it determines by comparing the count made in subtask 803 against a threshold. For example, when controller 507 counts more than 3 instances of a lack of coincidence between the output of bi-stable storage device 501-1 and the output of bi-stable storage device 502-1 in the course of 1000 signal transitions of the output of bi-stable storage device 501-1, then controller 507 can reasonably assume that clock signal Jp is at the later-in-time boundary of the eye. When the later-in-time boundary of the eye is detected, control passes to subtask 805; otherwise, control passes to subtask 802 where controller 507 pushes Jp further in an attempt to find the later-in-time boundary of the eye.

Subtasks 805 through 808 determine how far the clock signal assigned to bi-stable storage device 501-1 is from the sooner-in-time boundary of the eye.

At subtask 805, controller 507 sets a variable, Jn, equal to the clock signal assigned to bi-stable storage device 501-1. This can be represented by Equation 5.

$$Jn=\text{clock signal}(501\text{-}1) \tag{Eq. 5}$$

From subtask 801, selector 505 should already be directed to route the output of bi-stable storage device 501-1 to unanimity logic 506.

At subtask 806, controller 507 decrements the variable Jp mod R*B and directs selector 503 to route clock signal Jn to bi-stable storage device 502-1. This can be represented by Equation 6.

$$Jn=[Jn-1]\bmod R*B \tag{Eq. 6}$$

At subtask 807, controller 507 counts how many times unanimity logic 506 detects a lack of coincidence between the output of bi-stable storage device 501-1 and the output of bi-stable storage device 502-1 in the course of some number of transitions of the output of bi-stable storage device 501-1. Controller 507 is capable of detecting the number of transitions in the output of bi-stable storage device 501-1 because the output of selector 505 is fed into controller 507. For example, controller 507 advantageously counts how many times unanimity logic 506 detects a lack of coincidence between the output of bi-stable storage device 501-1 and the output of bi-stable storage device 502-1 in the course of 1000 signal transitions of the output of bi-stable storage device 501-1.

At subtask 808, controller 507 determines whether clock signal Jn is at the sooner-in-time boundary of the eye, which it determines by comparing the count made in subtask 807 against a threshold. For example, when controller 507 counts more than 3 instances of a lack of coincidence between the output of bi-stable storage device 501-1 and the output of bi-stable storage device 502-1 in the course of 1000 signal transitions of the output of bi-stable storage device 501-1, then controller 507 can reasonably assume that clock signal Jn is at the sooner-in-time boundary of the eye. When the sooner-in-time boundary of the eye is detected, control passes to task 808; otherwise, control passes to task 806 where controller 507 pushes Jn further in an attempt to find the sooner-in-time boundary of the eye.

At subtask 809, controller 507 compares the value of Jp to Jn. When Jp equals Jn, control passes to subtask 810. When Jp is greater than Jn, control passes to subtask 812, and when Jp is less than Jn, control passes to subtask 813.

There are two dissimilar circumstances that generate a value of Jp equal to Jn. First, the clock signal assigned to bi-stable storage device 501-1 could be causing bi-stable storage device 501-1 to be sampling exactly in the center of the eye, which is good. Alternatively, the clock signal assigned to bi-stable storage device 501-1 could be causing bi-stable storage device 501-1 to be sampling outside the eye (i.e., in the transition between two eyes), which is bad. The two circumstances can only be distinguished when the resolution R is high enough that single-channel deserializer 402-i can sample the serialized stream of bits at least three times, and typically four or more, in the eye of each bit.

At subtask 810, the two circumstances are distinguished. When Jp=1—which is a corollary of the test when Jn=1—control passes to subtask 811; otherwise control passes to task 703. When Jp=1, then the clock signal assigned to bi-stable storage device 501-1 is outside the eye and needs to be moved.

At subtask 811, controller 507 directs selector 503 to route the next numbered clock signal mod R*B to bi-stable storage device 501-1. This can be represented by Equation 7.

$$\text{clock signal}(501\text{-}1) = [\text{clock signal}(501\text{-}1) + 1] \bmod R*B \quad (\text{Eq. 7})$$

This begins the process of trying to push the clock signal assigned to bi-stable storage device 501-1 into the eye. From subtask 811 control passes back to subtask 801.

At subtask 812, controller 507 directs selector 503 to route the next numbered clock signal mod R*B to bi-stable storage device 501-1. This can be represented by Equation 8.

$$\text{clock signal}(501\text{-}1) = [\text{clock signal}(501\text{-}1) + 1] \bmod R*B \quad (\text{Eq. 8})$$

This begins the process of trying to push the clock signal, which is already in the eye, towards the center of the eye. From subtask 812 control passes to task 703.

At subtask 813, controller 507 directs selector 503 to route the next lower numbered clock signal mod R*B to bi-stable storage device 501-1. This can be represented by Equation 9.

$$\text{clock signal}(501\text{-}1) = [\text{clock signal}(501\text{-}1) - 1] \bmod R*B \quad (\text{Eq. 9})$$

This begins the process of trying to push the clock signal, which is already in the eye, towards the center of the eye. From subtask 813 control passes to task 703.

FIG. 9 depicts the subtasks that compose task 705.

Subtasks 901 through 904 determine how far the clock signal assigned to bi-stable storage device 501-X is from the later-in-time boundary of the eye.

At subtask 901, controller 507 sets a variable, Jp, equal to the clock signal assigned to bi-stable storage device 501-X. This can be represented by Equation 10.

$$Jp = \text{clock signal}(501\text{-}X) \quad (\text{Eq. 10})$$

Furthermore, as part of subtask 901, controller 507 directs selector 505 to route the output of bi-stable storage device 501-X to unanimity logic 506.

At subtask 902, controller 507 increments the variable Jp mod R*B and directs selector 503 to route clock signal Jp to bi-stable storage device 502-1. This can be represented by Equation 11.

$$Jp = [Jp + 1] \bmod R*B \quad (\text{Eq. 11})$$

At subtask 903, controller 507 counts how many times unanimity logic 506 detects a lack of coincidence between the output of bi-stable storage device 501-X and the output of bi-stable storage device 502-1 in the course of some number of transitions of the output of bi-stable storage device 501-X. Controller 507 is capable of detecting the number of transitions in the output of bi-stable storage device 501-X because the output of selector 505 is fed into controller 507. For example, controller 507 advantageously counts how many times unanimity logic 506 detects a lack of coincidence between the output of bi-stable storage device 501-X and the output of bi-stable storage device 502-1 in the course of 1000 signal transitions of the output of bi-stable storage device 501-X.

At subtask 904, controller 507 determines whether clock signal Jp is at the later-in-time boundary of the eye, which it determines by comparing the count made in subtask 903 against a threshold. For example, when controller 507 counts more than 3 instances of a lack of coincidence between the output of bi-stable storage device 501-X and the output of bi-stable storage device 502-1 in the course of 1000 signal transitions of the output of bi-stable storage device 501-X, then controller 507 can reasonably assume that clock signal Jp is at the later-in-time boundary of the eye. When the later-in-time boundary of the eye is detected, control passes to subtask 905; otherwise, control passes to subtask 902 where controller 507 pushes Jp further in an attempt to find the later-in-time boundary of the eye.

Subtasks 905 through 908 determine how far the clock signal assigned to bi-stable storage device 501-X is from the sooner-in-time boundary of the eye.

At subtask 905, controller 507 sets a variable, Jn, equal to the clock signal assigned to bi-stable storage device 501-X. This can be represented by Equation 12.

$$Jn = \text{clock signal}(501\text{-}X) \quad (\text{Eq. 12})$$

From subtask 901, selector 505 should already be directed to route the output of bi-stable storage device 501-X to unanimity logic 506.

At subtask 906, controller 507 decrements the variable Jp mod R*B and directs selector 503 to route clock signal Jn to bi-stable storage device 502-1. This can be represented by Equation 13.

$$Jn = [Jn - 1] \bmod R*B \quad (\text{Eq. 13})$$

At subtask 907, controller 507 counts how many times unanimity logic 506 detects a lack of coincidence between the output of bi-stable storage device 501-X and the output of bi-stable storage device 502-1 in the course of some number of transitions of the output of bi-stable storage device 501-X. Controller 507 is capable of detecting the number of transitions in the output of bi-stable storage device 501-X because the output of selector 505 is fed into controller 507. For example, controller 507 advantageously counts how many times unanimity logic 506 detects a lack of coincidence between the output of bi-stable storage device 501-X and the output of bi-stable storage device 502-1 in the course of 1000 signal transitions of the output of bi-stable storage device 501-X.

At subtask 908, controller 507 determines whether clock signal Jn is at the sooner-in-time boundary of the eye, which it determines by comparing the count made in subtask 907 against a threshold. For example, when controller 507 counts more than 3 instances of a lack of coincidence between the output of bi-stable storage device 501-X and the output of bi-stable storage device 502-1 in the course of 1000 signal transitions of the output of bi-stable storage device 501-X, then controller 507 can reasonably assume that clock signal Jn is at the sooner-in-time boundary of the eye. When the sooner-in-time boundary of the eye is detected, control passes to task 908; otherwise, control passes to task 906 where controller 507 pushes Jn further in an attempt to find the sooner-in-time boundary of the eye.

At subtask 909, controller performs a sanity check to ensure that no two of bi-stable storage device 501-1 through 501-B ever capture the same bit. This sanity check is accomplished in two ways. First, if either Jp or Jn advance too far—as advantageously, but not necessarily, measured in clock signal numbers—without encountering a boundary of the eye, then an error condition is declared and control passes to a restart in FIG. 7. Second, if the clock signals assigned to any two bi-stable storage devices become too close in phase—as advantageously, but not necessarily, measured in clock signal numbers—then an error condition is declared and control passes to a restart in FIG. 7. In accordance with the illustrative embodiment, if any two of bi-stable storage devices 501-1 through 501-B that have completed task 705 have clock signal numbers within 0.66R of each other—which is roughly equivalent to 240°/B of each other—then an error condition is declared and control passes to restart in FIG. 7.

At subtask 910, controller 507 compares the value of Jp to Jn. When Jp is greater than or equal to Jn, control passes to subtask 912; otherwise control passes to subtask 911.

At subtask 911, controller 507 directs selector 503 to route the next higher numbered clock signal mod R*B to bi-stable storage device 501-X. This can be represented by Equation 14.

$$\text{clock signal}(501\text{-}X)=[\text{clock signal}(501\text{-}X)+1]\bmod R^*B \qquad (\text{Eq. 14})$$

This begins the process of trying to push the clock signal, which is already in the eye, towards the center of the eye. From subtask 911 control passes to task 706.

At subtask 912, controller 507 directs selector 503 to route the next lower numbered clock signal mod R*B to bi-stable storage device 501-X. This can be represented by Equation 15.

$$\text{clock signal}(501\text{-}X)=[\text{clock signal}(501\text{-}X)-1]\bmod R^*B \qquad (\text{Eq. 15})$$

This begins the process of trying to push the clock signal, which is already in the eye, towards the center of the eye. From subtask 912 control passes to task 706.

In some alternative embodiments of the present invention, single-channel deserializer 402-i comprises two bi-stable storage devices (e.g., bi-stable storage device 502-2 in addition to bi-stable storage device 502-1, etc.) to perform subtasks 802 through 804 in parallel with subtasks 806 through 808 and to perform subtasks 902 through 904 in parallel with subtasks 906 through 908. In these embodiments, bi-stable storage devices 502-1 and 502-2 are together serially associated with each of bi-stable storage devices 501-1 through 501-B. In other words, single-channel deserializer 402-i comprises two bi-stable storage devices—one clocked ahead of the bi-stable storage device 501-X and one clocked behind the bi-stable storage device 501-X to parallelize the process of locating the sooner-in-time boundary of the eye and the later-in-time boundary of the eye. In these embodiments, the outputs of the two bi-stable storage devices can be fed into logic that performs a 3-input coincidence function with the output of selector 505, or each of the two bi-stable storage devices can be fed into separate logic circuits that each perform a 2-input coincidence function with the output of selector 505. Controller 507 can receive the output of the 3-input coincidence function or the output of both of the separate 2-input coincidence functions to locate the sooner-in-time boundary of the eye and the later-in-time boundary of the eye.

In some alternative embodiments of the present invention, single-channel deserializer 402-i comprises B bi-stable storage devices (e.g., bi-stable storage devices 502-2 through 502-B in addition to bi-stable storage device 502-1, etc.) to perform subtasks 902 through 904 in parallel for all of bi-stable storage devices 501-1 through 501-B and to perform subtasks 906 through 908 in parallel for all of bi-stable storage devices 501-1 through 501-B. In these embodiments, bi-stable storage device 502-X is associated with bi-stable storage device 501-X. In other words, single-channel deserializer 402-i locates the sooner-in-time boundary of the eye for all of bi-stable storage devices 501-1 through 501-B in parallel and locates the later-in-time boundary of the eye for all of bi-stable storage devices 501-1 through 501-B. In these embodiments, the output of bi-stable storage device 502-X is fed into a distinct logic circuit that performs a 2-input coincidence function with the output of bi-stable storage device 501-X. Controller 507 receives the output of each of the distinct logic circuits to locate the sooner-in-time boundary of each eye and then the later-in-time boundary of each eye.

In some alternative embodiments of the present invention, single-channel deserializer 402-i comprises 2B bi-stable storage devices (e.g., bi-stable storage devices 502-2 through 502-2B in addition to bi-stable storage device 502-1, etc.) to perform subtasks 802 through 804 in parallel with subtasks 806 through 808, subtasks 902 through 904, and subtasks 906 through 908. In these embodiments, one pair of bi-stable storage devices 502-1 through 502-2B are uniquely associated with one of bi-stable storage devices 501-1 through 501-B. In other words, single-channel deserializer 402-i comprises 2B bi-stable storage devices—B of which are clocked ahead of bi-stable storage devices 501-1 through 501-B and B of which are clocked behind bi-stable storage devices 501-1 through 501-B—to parallelize the process of locating the sooner-in-time boundary of each eye and the later-in-time boundary of each eye. In these embodiments, the outputs of each pair of bi-stable storage devices 502-1 through 502-2B are fed into logic that performs a 3-input coincidence function with the output of the associated bi-stable storage device of bi-stable storage devices 501-1 through 501-B. Controller 507 can receive the output of the 3-input coincidence function to locate the sooner-in-time boundary of the eye and the later-in-time boundary of the eye. Alternatively, the outputs of each pair of bi-stable storage devices 502-1 through 502-2B are fed into a 2-input coincidence function with the output of the associated bi-stable storage device of bi-stable storage devices 501-1 through 501-B. Controller 507 can receive output of the separate 2-input coincidence functions to locate the sooner-in-time boundary of the eye and the later-in-time boundary of the eye.

In some alternative embodiments of the present invention, multichannel deserializer 202 comprises one multiphase waveform generator for all single-channel deserializers 402-1 through 402-N rather than one multiphase waveform generator for each of single-channel deserializers 402-1 through 402-N.

In some alternative embodiments of the present invention, multichannel deserializer 202 comprises one controller for all single-channel deserializers 402-1 through 402-N rather than one controller for each of single-channel deserializers 402-1 through 402-N.

It is to be understood that the above-described embodiments are merely illustrative of the present invention and that many variations of the above-described embodiments can be devised by those skilled in the art without departing from the scope of the invention. It is therefore intended that such variations be included within the scope of the following claims and their equivalents.

What is claimed is:

1. An apparatus comprising:
   a first bi-stable storage device for receiving a first binary waveform and a first clock signal and for generating a second binary waveform based on said first binary waveform and on said first clock signal;
   a second bi-stable storage device for receiving said first binary waveform and a second clock signal and for generating a third binary waveform based on said first binary waveform and on said second clock signal; and
   unanimity logic for generating a fourth binary waveform based on a coincidence function of said second binary waveform and said third binary waveform.

2. The apparatus of claim 1 wherein said second clock signal has the same frequency as said first clock signal and said second clock signal has a different phase than said first clock signal.

3. The apparatus of claim 2 further comprising a controller for adjusting the phase difference between said first clock signal and said second clock signal based on said fourth binary waveform.

4. The apparatus of claim 3 wherein said controller is a microprocessor.

5. An integrated circuit comprising:
a word synchronization module for outputting a parallel word based on a first symbol and a second symbol;
a first single-channel deserializer for outputting said first symbol based on a first serialized stream of bits, wherein said first single-channel deserializer comprises a first plurality of bi-stable storage devices that: (i) are clocked out of phase with respect to each other, (ii) are each presented in parallel with said first serialized stream of bits, and (iii) each capture a different bit in said first serialized stream of bits; and
a second single-channel deserializer for outputting said second symbol based on a second serialized stream of bits, wherein said second single-channel deserializer comprises a second plurality of bi-stable storage devices that: (i) are clocked out of phase with respect to each other, (ii) are presented in parallel with said second serialized stream of bits, and (iii) each capture a different bit in said second serialized stream of bits.

6. The integrated circuit of claim 5 further comprising:
a multiphase waveform generator for generating a plurality of clock signals that are out of phase with respect to each other; and
a selector for routing a different one of said plurality of clock signals to each of said first plurality of bi-stable storage devices.

7. The integrated circuit of claim 6 further comprising:
a controller for directing said selector to route a different one of said plurality of clock signals to each of said first plurality of bi-stable storage devices in said first single-channel deserializer, and for determining when at least one of said first plurality of bi-stable storage devices is clocking-in a stable bit.

8. The integrated circuit of claim 6 wherein said first single-channel deserializer further comprises:
an additional bi-stable storage device that is clocked out of phase with respect to each of said first plurality of bi-stable storage devices and that clocks in a bit from said first serialized stream of bits; and
unanimity logic for generating a first binary waveform based on a coincidence function of an output of said additional bi-stable storage device and an output of one of said first plurality of bi-stable storage devices.

9. The integrated circuit of claim 8 further comprising:
a controller for receiving said first binary waveform from said unanimity logic and for directing said selector to route a different one of said plurality of clock signals to at least one of said first plurality of bi-stable storage devices based on said first binary waveform.

10. The integrated circuit of claim 9 wherein said controller is a microprocessor.

11. An integrated circuit comprising:
a plurality of single-channel deserializers for outputting different symbols in a word, wherein each of said plurality of single-channel deserializers comprises:
(i) a first bi-stable storage device for receiving a first binary waveform and a first clock signal and for generating a second binary waveform based on said first binary waveform and on said first clock signal;
(ii) a second bi-stable storage device for receiving said first binary waveform and a second clock signal and for generating a third binary waveform based on said first binary waveform and on said second clock signal; and
(iii) unanimity logic for generating a fourth binary waveform based on a coincidence function of said second binary waveform and said third binary waveform.

12. The integrated circuit of claim 11 wherein said second clock signal has the same frequency as said first clock signal and said second clock signal has a different phase than said first clock signal.

13. The integrated circuit of claim 12 further comprising a controller for adjusting the phase difference between said first clock signal and said second clock signal based on said fourth binary waveform.

14. The integrated circuit of claim 13 wherein said controller is a microprocessor.

15. An integrated circuit comprising:
a plurality of single-channel deserializers for outputting different symbols in a word, wherein each of said plurality of single-channel deserializers comprises:
(i) a first bi-stable storage device for receiving a first binary waveform and a first clock signal and for generating a second binary waveform based on said first binary waveform and on said first clock signal; and
(ii) a second bi-stable storage device for receiving said first binary waveform and a second clock signal and for generating a third binary waveform based on said first binary waveform and on said second clock signal;
wherein said second clock signal has the same frequency as said first clock signal and said second clock signal has a different phase than said first clock signal.

16. The integrated circuit of claim 15 where each of said plurality of single-channel deserializers further comprises:
(iii) a third bi-stable storage device for receiving said first binary waveform and a third clock signal and for generating a fourth binary waveform based on said first binary waveform and on said third clock signal;
wherein said third clock signal has the same frequency as said first clock signal and said third clock signal has a different phase than either of said first clock signal or said second clock signal.

\* \* \* \* \*